United States Patent
Kakoschke et al.

(10) Patent No.: US 6,888,753 B2
(45) Date of Patent: May 3, 2005

(54) MEMORY CELL ARRAY COMPRISING INDIVIDUALLY ADDRESSABLE MEMORY CELLS AND METHOD OF MAKING THE SAME

(75) Inventors: Ronald Kakoschke, München (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/680,383

(22) Filed: Oct. 6, 2003

(65) Prior Publication Data

US 2004/0079986 A1 Apr. 29, 2004

Related U.S. Application Data

(63) Continuation of application No. PCT/EP02/03041, filed on Mar. 19, 2002.

(30) Foreign Application Priority Data

Apr. 5, 2001 (DE) .......................................... 101 17 037

(51) Int. Cl.[7] .............................................. G11C 11/34
(52) U.S. Cl. .................................. 365/185.11; 438/622
(58) Field of Search ...................... 365/185.11; 438/622

(56) References Cited

U.S. PATENT DOCUMENTS

| | | | | |
|---|---|---|---|---|
| 5,032,529 A | * | 7/1991 | Beitman et al. | 438/212 |
| 5,411,905 A | | 5/1995 | Acovic et al. | 438/156 |
| 5,515,319 A | | 5/1996 | Smayling et al. | 365/185.27 |
| 5,760,437 A | | 6/1998 | Shimoji | 257/316 |
| 5,960,265 A | | 9/1999 | Acovic et al. | 438/157 |

| | | | |
|---|---|---|---|
| 2002/0038882 A1 | | 4/2002 | Hartmann et al. |

FOREIGN PATENT DOCUMENTS

| | | |
|---|---|---|
| DE | 198 23 733 A1 | 12/1999 |
| EP | 0 896 370 A1 | 2/1999 |
| JP | 07 094 686 | 4/1995 |
| JP | 07106451 A | 4/1995 |
| JP | 09 116 120 | 5/1997 |
| JP | 09 213 910 | 8/1997 |

OTHER PUBLICATIONS

Chi–Nan Brian Li et al: "A Novel Uniform–Channel–Program–Erase (UCPE) Flash EEPROM Using An Isolated P–well Structure", *Conference Proceedings of IEDM 2000, San Francisco, Dec. 10–13, 2000*, 4 pgs.

* cited by examiner

*Primary Examiner*—M. Tran
(74) *Attorney, Agent, or Firm*—Laurence A. Greenberg; Werner H. Stemer; Ralph E. Locher (57) ABSTRACT

A memory cell array comprises a plurality of memory transistors arranged in a two-dimensional array, each memory transistor having two source/drain regions arranged in a first direction of the memory cell array with a channel substrate region therebetween, and a gate structure arranged above the channel substrate region. The source/drain regions and channel substrate regions are formed in a substrate arranged on an insulating layer, with the channel substrate regions of memory transistors adjacent each other in the first direction being separated from each other by respective source/drain regions extending down to the insulating layer. The source/drain regions and the channel substrate regions of memory transistors adjacent each other in a second direction of the memory cell array furthermore are isolated from each other by trenches filled with insulating material and formed in the substrate so as to extend down to the insulating layer.

11 Claims, 6 Drawing Sheets

MEMORY CELL ARRAY COMPRISING INDIVIDUALLY ADDRESSABLE MEMORY CELLS AND METHOD OF MAKING THE SAME

CROSS-REFERENCE TO RELATED APPLICATION

This application is a continuation of copending International Application No. PCT/EP02/03041, filed Mar. 19, 2002, which designated the United States and was not published in English.

BACKGROUND OF THE INVENTION

1. Field of the Invention

The present invention relates to a memory cell array and to a method of making the same, and in particular to such a memory cell array the memory cells of which are addressable individually.

2. Description of Prior Art

Non-volatile memories (NVM; NVM=non-volatile memories) are broadly used nowadays, with floating-gate memory cells being utilized in particular. A distinction is made between two types of memory modules, data memories on the one hand and program memories on the other hand.

In case of data memories, it is necessary that small memory units, for example individual bits, 1 byte consisting of 8 bits, or a word consisting of 128 bits, must be erasable and programmable in freely selectable manner, which may lead to numerous reprogramming cycles.

In contrast thereto, in case of program memories, which are realized mainly in the form of flash memories, only large units, for example a sector with 512 bits, can be erased as a whole before bitwise writing or programming takes place. For example, if only 1 byte is to be written anew, the entire sector has to be erased and re-written. This means unnecessary burdening of the cells that actually were not to be addressed. The lifetime thereof is reduced considerably thereby. The functionality of a program memory is thus restricted. In contrast thereto, higher storage density can be realized with a flash memory since smaller cell areas are necessary.

In the scope of the present application, the erasure of a memory cell is to be understood as being the respective process in which charges are introduced into the memory medium, which is the floating gate in case of the floating-gate memory cells mentioned, of a memory cell. Writing or programming is to be understood as the process in which corresponding charges are removed, i.e. extracted, from the memory medium.

For realizing data memories in which small memory units have to be erasable and programmable in freely selective manner, it is known to arrange such memory units in a word line and separate them by so-called byte switches. However, such byte switches result in the memory module being increased considerably.

As an alternative to byte switches, it is known from the prior art to employ split voltages, i.e. to supply for selective programming and erasing, respectively, part of the voltage via the word line and another part via the bit line of a memory cell.

Figure 6A:
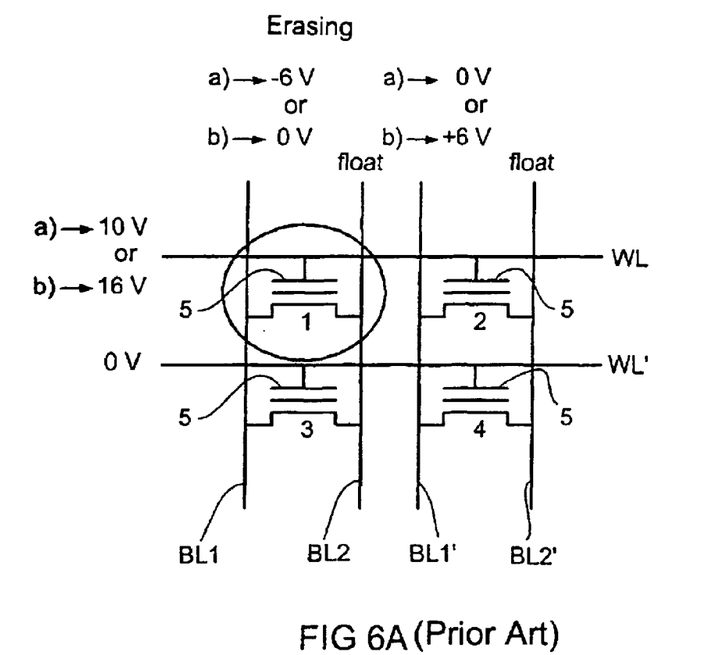
FIGS. 6a and 6b show schematic views for illustrating the voltages to be applied for erasure and programming in a known memory cell array.

An example of an architecture using such split voltages will be elucidated hereinafter in more detail with reference to FIGS. 6a and 6b which schematically illustrate a section of a memory cell array comprising four memory cells 1, 2, 3 and 4. In FIG. 6a, the voltages applied are shown for erasure of the encircled memory cell 1, whereas FIG. 6b shows the voltages applied for programming of the encircled memory cell 1.

The memory cells 1 to 4 are, for example, conventional n-channel EEPROM memory cells of the flotox type (flotox=floating gate tunnel oxide). Such memory cells have tunnel injection areas that are not shown. With such n-channel EEPROM cells, in accordance with the terminology used herein, programming is equivalent to the extraction of electrons from the floating gate, whereas erasure is equivalent to the application of electrons to the floating gate. Word lines and bit lines are provided for application of the necessary voltages.

Figure 6B:
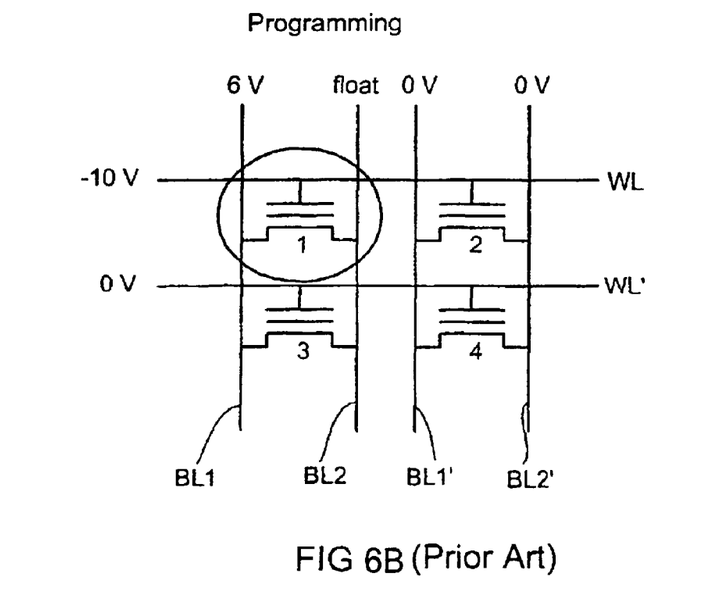

As illustrated in FIGS. 6a and 6b, the control gates 5 of memory cells 1 and 2 arranged in a row are connected to a word line WL, whereas the control grates 5 of the memory cells 3 and 4 arranged in the row therebelow are connected to a word line WL'. Furthermore, the source regions of the memory cells 1 and 3 arranged in the left-hand column are connected to a first bit line BL1, while the drain regions thereof are connected to a second bit line BL2. In like manner, the source regions of the memory cells 2 and 4 arranged in the right-hand column are connected to a first bit line BL1', while the drain regions thereof are connected to a second bit line BL2'.

For selectively programming or erasing a memory cell, suitable voltages are supplied via an associated word line and the two associated bit lines, so that only for the memory cell located at the respective point of intersection of the word lines and the two bit line, there is applied a sufficiently high potential difference both at the control gate and at the drain region for effecting erasure or programming, respectively, of the respective memory cell by means of a Fowler-Nordheim tunneling effect. Neither the drain potential alone nor the control gate potential alone are sufficient for effecting such tunneling, so that the desired effect occurs only at the memory cell located at the point of intersection.

FIG. 6a illustrates two cases a) and b) of voltages applied to the word lines and bit lines for erasure of the encircled memory cell 1.

In the first case a), a voltage of +10V is applied to the word line WL associated with the cell 1 to be erased, and a voltage of −6V is applied to the associated bit line BL1, whereas the associated bit line BL2 is floating. A voltage of 0V is applied to word line WL' and bit line BL1', and bit line BL2' is floating.

In the second case b), a voltage of +16V is applied to the word line WL associated with memory cell 1 to be erased, and a voltage of 0V is applied to the associated bit line BL1, whereas the associated bit line BL2 is floating. A voltage of 0V is applied to word line WL', a voltage of +6V is applied to bit line BL1', and bit line BL2' is floating.

As shown in FIG. 6b for programming of the selected cell 1, a voltage of −10V is applied to the associated word line WL, whereas a voltage of +6V is applied to the associated bit line BL1 and the associated bit line BL2 is floating. The word line WL' and the bit lines BL1' and BL2' have a potential of 0V each.

In addition to the split voltages to be applied to word lines and bit lines, as described hereinbefore with reference to FIGS. 6a and 6b, it is necessary in addition that the potentials suitable for erasure are applied to the tunnel windows of the memory cells. In case of erasure as in case b), positive potentials have to be applied as so-called inhibit voltage to the tunnel window of cells not to be erased, whereas in case a) negative potentials have to be applied to the tunnel window of the cell addressed for erasure thereof. Negative potentials in general cannot be applied to a bit line in selective manner since the source/drain regions are polarized in forward direction.

For supplying a positive potential to the tunnel window, a highly doped $n^+$ injection area is necessary below the tunnel window, which causes an increase in area of the cell. This increase in area may be reduced by utilizing the drain overlap and the source overlap, respectively, as injection area, which however results in a reliability problem in erasure due to the high current density. If the injection area mentioned is dispensed with completely, a positive potential can be applied to the tunnel oxide of the cell via the well only. Positive potentials require a p-well in a deep n-well, which results in a so-called "triple well", thereby increasing process complexity. Such a technology using an isolated p-well structure for each cell column is described by Chi-Nan Brian Li et al. "A Novel Uniform-Channel-Program-Erase (UCPE) Flash EEPROM Using An Isolated P-Well Structure, Conference Proceedings of IEDM 2000, San Francisco, 10th to 13th Dec. 2000.

Individual isolation of wells under a cell would require an immense amount of space. Thus, only the selection of large memory blocks is possible.

Without the use of an injection area, suitable split voltage conditions in erasing a cell may also be achieved by exploiting the fact that, in case b) of FIG. 6a, a channel is created at the memory cell 2 via which the positive potential can be supplied to the cell. However, this is no longer possible in writing since, with negative voltages, there is no channel created at the control gate. Positive or negative voltages must then be supplied via the well. Thus, in this case too, only large memory blocks can be globally erased.

If there are no split voltages utilized, a high voltage can be supplied via respective bit lines to effect Fowler-Nordheim tunneling; however, this high voltage then has to be blocked away from the cells not addressed by means of select gates.

A memory cell array based on an SOI wafer (SOI=silicon-on-insulator) is described in U.S. Pat. No. 5,796,142. In case of the memory cell array described there, the source/drain regions of the memory transistors are formed in the silicon layer of an SOI wafer down to the insulating layer thereof. Thus, strip-shaped substrate regions are formed between the respective source/drain regions which are separated from each other by the source/drain regions, so that the substrate regions of a row of memory cells are isolated from the substrate regions of an adjacent row of memory cells. Thus, it is possible to apply suitable voltages to the word line connected to the control gate of a particular cell and to the strip-shaped substrate region or the substrate line of the respective memory cell, in order to effect both an erase and a programming operation between the floating gate and the substrate on the basis of the Fowler-Nordheim tunneling effect.

From JP 09 116120 A (and the associated Patent Abstracts of Japan, Vol. 1997, Nov. 9, Sep. 30, 1997), a memory cell array is known in which the source regions, the drain regions, and the substrate regions are separated from each other along word lines of adjacent memory cells by oxide regions. In the direction perpendicular to the word lines, the drain regions are continuously formed as data line, the source regions are continuously formed as source line, and the substrate regions are continuously formed as substrate line. For programming or erasing of respective memory cells, appropriate voltages are applied to the word lines, data lines, source lines, and substrate lines.

From JP 09 213910 A (and the associated Patent Abstracts of Japan, Vol. 1997, Nov. 12, Dec. 25, 1997), a memory cell array is also known in which the substrate regions are isolated from each other from memory transistors adjacent along word lines by oxide regions. Substrate regions perpendicularly adjacent to the word lines are connected to each other. For programming or erasing of memory cells, respective voltages are applied to word lines, substrate regions of the transistors, and bit lines.

Form U.S. Pat. No. 5,760,437, a memory cell array is known which is realized on a semiconductor substrate, the drain/source regions of the memory cells being formed in a surface of the semiconductor substrate. The channel substrate regions associated with adjacent memory cells are not isolated from each other.

SUMMARY OF THE INVENTION

It is the object of the present invention to provide a memory cell array and a method of making the same, which on the one hand has a small cell size of the individual memory cells and on the other hand can be utilized both as data memory and as program memory.

The present invention is a memory cell array, having:

a plurality of memory transistors arranged in a two-dimensional array wherein the two-dimensional array is defined by a first direction and a second direction, each memory transistor having two source/drain regions arranged in a first direction of the memory cell array with a channel substrate region therebetween, and a gate structure arranged above the channel substrate region, said source/drain regions and channel substrate regions being formed in a substrate arranged on an insulating layer, and the channel substrate regions of memory transistors adjacent each other in the first direction being separated from each other by respective source/drain regions extending down to the insulating layer, and said source/drain regions and channel substrate regions of memory transistors adjacent each other in a second direction of the memory cell array being isolated from each other by trenches filled with insulating material and formed in the substrate so as to extend down to the insulating layer.

The present invention, furthermore, is a method of making a memory cell array, comprising the steps of:

forming strip-shaped trenches, filled with insulating material, in a semiconductor substrate arranged on an insulating layer, said insulating trenches extending down to the insulating layer;

forming strip-shaped gate structures which extend substantially perpendicularly to the trenches filled with an insulating material and, together with said trenches, constitute a grid-like structure; and doping the substrate regions left free between the grid-like structure so as to form source/drain regions extending down to the insulating layer.

The present invention is based on the finding that it is possible to address individual memory transistors without supplying the substrate potential through a specific contact, in that the semiconductor substrate under the gate structure of a respective transistor, i.e. the channel substrate region, is isolated completely from that of the other cells. Laterally, this isolation is effected by the p-n junctions of the source/drain regions, whereas perpendicularly thereto, this isolation is achieved by trenches filled with an insulating material, preferably oxide. The isolation of the channel substrate regions in downward direction is achieved by the insulating layer, which is preferably the thick oxide layer of an SOI wafer.

With such a construction of a memory cell array, the substrate potential, i.e. the potential of the channel substrate region, for enabling Fowler-Nordheim tunneling, need not be supplied through a specific contact, but is effected by the source/drain contacts using physical effects, namely the GIDL effect (GIDL=gate induced drain leakage), of a diode polarized in forward direction as well as the channel formation of the memory transistor. Thus, there are no specific terminals of the isolated substrate regions necessary, which would result in larger cell areas. In addition thereto, the invention requires neither selection transistors for blocking off cells not addressed, nor injection areas under the tunnel window. Rather, the complete isolation of the channel substrate regions of the individual memory cells from each other renders possible that suitable voltages are applied merely to word lines and bit lines in order to permit addressing of individual selected memory cells.

The present invention is suitable in particular for realizing memory cell arrays using EEPROM cells with floating gate, in which the gate structure of the memory transistors has a layer sequence of gate oxide layer, polycrystalline layer as floating gate, intermediate dielectric, which preferably is an oxide nitride oxide layer sequence (ONO layer sequence), and polycrystalline layer as control gate.

With such a two-dimensional memory cell array, the control gates of a row of memory transistors arranged in one direction are connected to each other in electrically conductive manner via word lines. Furthermore, the source/drain regions of a row of memory transistors arranged in a direction perpendicular thereto are connected via bit lines; according to the invention, there are preferably provided a first and a second bit line for such a row of memory transistors, with the source/drain regions of the memory transistors of the row being connected in electrically conductive manner to the first bit line and the second bit line in alternating manner. In this manner, it is advantageously possible to apply suitable voltages to word lines and bit lines so as to permit selective addressing, i.e. erasure or programming, of individual memory cells.

By the method of making a memory cell array according to the invention, the insulating trenches are formed first in the semiconductor substrate, and thereafter the gate structures are formed. Following this, the source/drain regions can be doped in self-aligning manner.

In contrast to the memory cell array described in U.S. Pat. No. 5,796,142, which has isolated substrate lines only, the invention provides for an isolated substrate area for each individual memory cell. Thus, contrary to the technology described in U.S. Pat. No. 5,796,142, the present invention is not only applicable merely to an "AND virtual ground architecture" permitting sequential data accessing only, which requires too much accessing time in case of freely selective access. Rather, according to the invention, a NOR-type architecture may be realized which permits rapid freely selective accessing. Another disadvantage of the technology described in U.S. Pat. No. 5,796,142, which is eliminated according to the invention, consists in that the connection of the substrate line (body line) is not guaranteed. On the one hand, the isolation between source/drain regions and the substrate line necessitates a thin silicon layer over the SOI oxide. On the other hand, the silicon layer has to be sufficiently thick for avoiding a continuous depletion zone in the substrate area. If the depletion zone is deeper than the silicon substrate, the potential cannot be supplied, or just be slowly supplied, to the cell due to the missing or low conductivity of the substrate. This problem does not exist in the present invention since the substrate potential need not be supplied through a specific contact.

Another restriction of the memory described in U.S. Pat. No. 5,796,142 is due to the low coupling factor of the cell, resulting in very long write/erase durations in the range from 20 ms to 100 ms. If a parallel operation in erasing and writing, i.e. simultaneous erasure/writing of many cells, is not possible, for example if only one or few bytes are to be addressed, this constitutes a restriction that is not tolerable for many applications. Faster write/erase durations could be obtained only by a higher coupling factor and a cell area increase associated therewith, which however would lead to loss of the advantage of the "AND virtual ground architecture" with respect to the maximum packing density.

The present invention thus is suited in particular for realizing an NVM cell field consisting of floating gate cells that can be erased and programmed by Fowler-Nordheim tunneling, in which neither injection areas under the tunnel window nor byte switches are necessary. The memory cells thus may be both programmed in bitwise manner and erased in bitwise manner. This is achieved according to the invention in that the cell field is realized on an SOI substrate and each cell is given its own isolated substrate area. With such a construction, the substrate potential, i.e. the channel substrate region potential, may be supplied via the bit line contacts, i.e. the source/drain contacts, and need not be effected via substrate contacts provided specifically for this purpose.

Further developments of the present invention are set forth in the dependent claims.

BRIEF DESCRIPTION OF THE DRAWINGS

A preferred embodiment of the present invention will be elucidated in more detail hereinafter with reference to the accompanying drawings in which.

DESCRIPTION OF THE PREFERRED EMBODIMENTS

Figure 1:
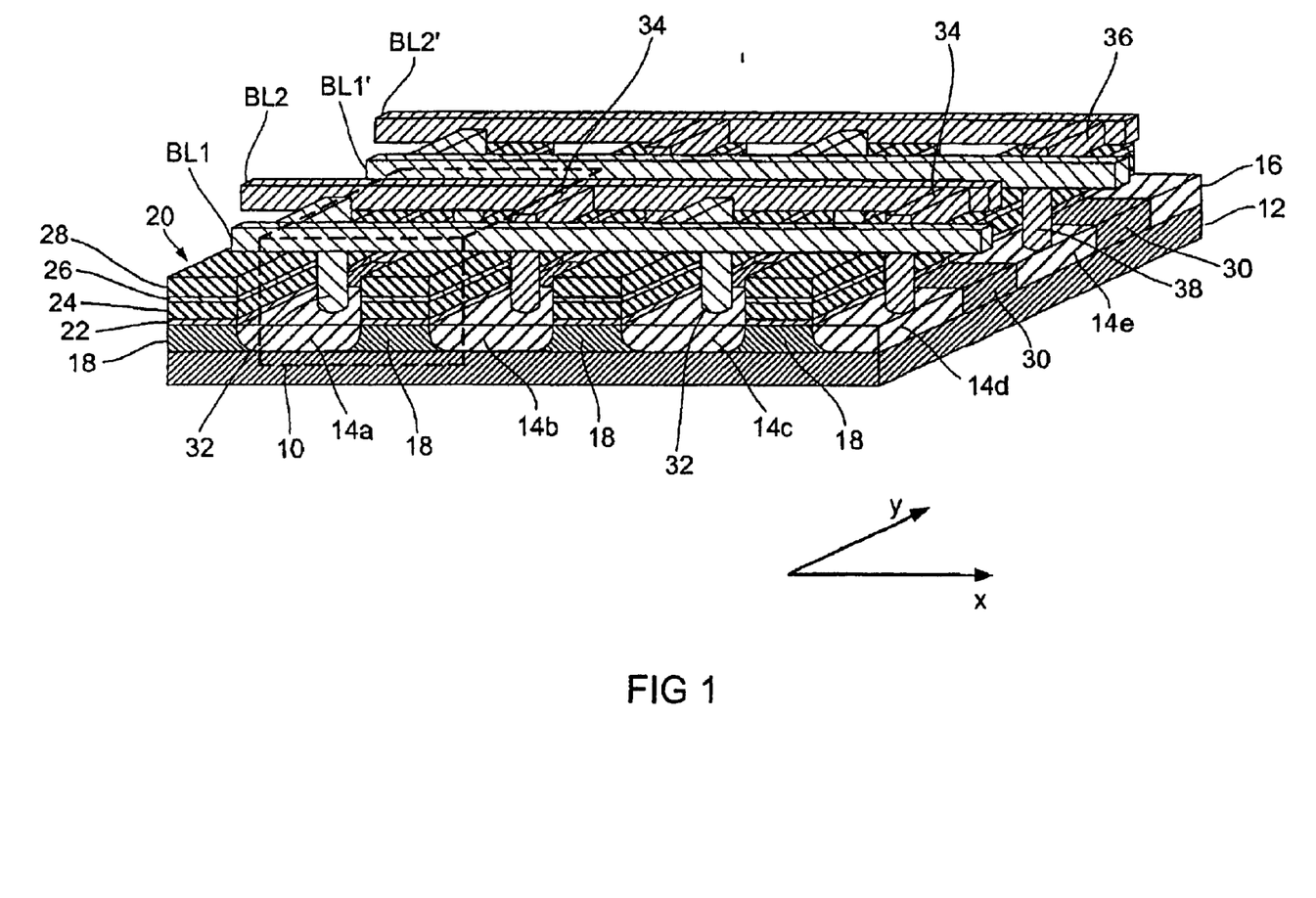
FIG. 1 shows a schematic perspective view of a memory cell array according to the invention.

In the following, the present invention will be elucidated in more detail by way of a preferred embodiment, in which the memory cells are formed by floating-gate EEPROM memory cells. FIG. 1 shows a schematic perspective view of such a memory cell array according to the invention, with an individual memory cell being indicated in FIG. 1 in the form of a frame 10 in broken lines.

The memory cell array according to the invention is composed on an insulating layer 12, which preferably is an oxide layer of an SOI wafer. Source/drain regions 14a, 14b, 14c and 14d are formed in a semiconductor layer 16 arranged on insulating layer 12, said semiconductor layer 16 being preferably the silicon layer of an SOI wafer. By way of the source/drain regions, respective channel substrate regions 18 are defined in the semiconductor layer 16 in addition. Above the channel substrate regions 18, there are formed respective gate structures 20 which, in the embodiment illustrated, consist of a gate stack comprising a gate oxide layer 22, a polycrystalline silicon layer 24 as floating gate, an intermediate dielectric 26, and a polycrystalline silicon layer 28 as control gate. The intermediate dielectric 26 preferably is formed by an ONO layer sequence (ONO= oxide-nitride-oxide).

The memory cell provided with frame 10 in FIG. 1 thus is constituted by a source region 14a, a drain region 14b, a channel substrate region 18 arranged between the same, and the gate structure 20 arranged on channel region 18. The source/drain regions 14a and 14b are preferably n+-doped, while the semiconductor layer 16 is preferably a p-type layer, so that the channel substrate regions 18 are p-type regions as well.

As can be seen in FIG. 1 in addition, the channel substrate regions 18 of memory cells 10 adjacent each other in x-direction are separated from each other by the respective source/drain regions 14a, 14b, 14c, and 14d, which extend down to insulating layer 12. Furthermore, the channel substrate regions of memory cells 10 adjacent each other in y-direction are isolated from each other by trenches filled with an insulating material, preferably oxide, and extending down to the insulating layer 12 as well. The insulating trenches extend completely through the semiconductor layer 16 in x-direction so that the channel substrate regions 18 and the source/drain regions of all memory cells adjacent each other in y-direction are isolated from each other, as can be seen in FIG. 1 by way of the source/drain region 14d and the source/drain region 14e adjacent thereto in y-direction.

The gate structures 20 are formed such that they are arranged above the channel substrate regions of a row of memory cells arranged in y-direction each. With this configuration, the control gates of the memory cells arranged in such a row in y-direction constitute respective word lines WL. It should be noted here that, for providing these word lines with low-impedance design, it is common practice to apply a metallic layer (not shown) to the control gate portions formed of polysilicon.

As can be seen in FIG. 1 furthermore, the preferred embodiment according to the present invention has, for each row of memory cells arranged in x-direction, two bit lines BL1 and BL2, with the source/drain regions 14a, 14b, 14c and 14d being connected to the bit lines BL1 and BL2 in alternating manner. Thus, one source/drain region of a memory cell is connected to the first bit line BL1, and the other source/drain region of the same memory cell is connected to the second bit line BL2. More specifically, in the memory cell provided with frame 10, the source region 14a is connected to the first bit line BL1, while the drain region 14b is connected to the second bit line BL2. For the row of memory cells adjacent each other in y-direction in FIG. 1, there are provided two bit lines BL1' and BL2' in like manner.

Figure 2:
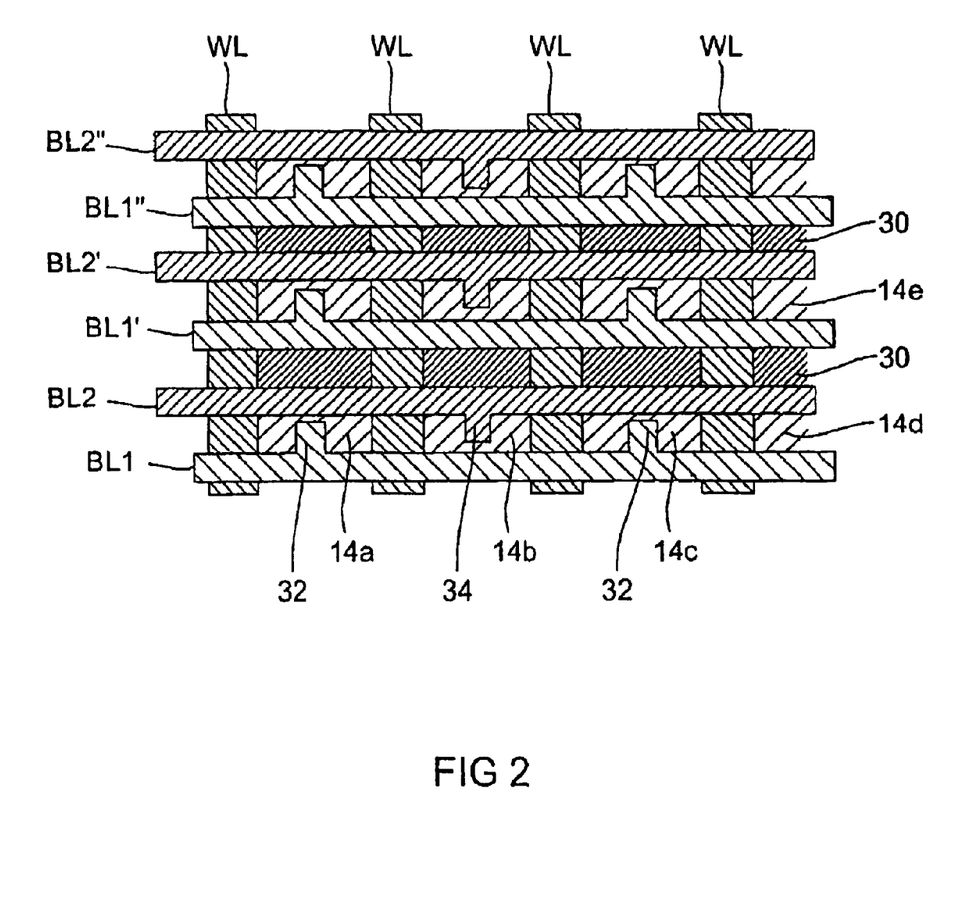
FIG. 2 shows a schematic plan view of the memory cell array of FIG. 1.

As regards the resulting structure, reference is to be made to the plan view shown in FIG. 2 in addition which illustrates furthermore first and second bit lines BL1" and BL2" for a third row of memory cells.

As shown, the first bit line BL1 is connected to source/drain regions 14a and 14c by conductive, e.g. metallic connecting means 32, while the second bit line BL2 is connected to source/drain regions 14b and 14c via conductive connecting means 34. The metallic connecting means 32, 34 are shown just in schematic manner and, in the embodiment illustrated, have laterally extending connecting sections, one thereof being designated 36 in exemplary manner, as well as vertical through-plated sections, one thereof being designated 38 in exemplary manner. However, it is to be noted here that the representations in this regard in FIGS. 1 and 2 are just of schematic nature, it being apparent to an expert that the connecting means 32, 34 may have an arbitrary appropriate form and may be manufactured using arbitrary appropriate technologies in order to connect source/drain regions to first and second bit lines, respectively, in alternating fashion. It is to be noted here, furthermore, that for reasons of convenience, FIGS. 1 and 2 do not show insulating material provided in the memory cell array between the gate structures 28 and between the bit lines and word lines for isolating the same from each other.

As an example of a memory cell array according to the invention has been described now in the section shown in FIGS. 1 and 2, it is to be pointed out that the memory cell array according to the invention can be manufactured using conventional method steps. As regards the manufacturing method for the memory cell array according to the invention, it should merely be pointed out that the insulating trenches 30 can be formed using conventional technologies as well. According to the invention, the trenches are etched in the semiconductor layer 16 preferably before formation of the gate structures 28 and are then filled with an insulating material, e.g. oxide. It is possible to employ arbitrary methods for planarization after filling of the trenches with the insulating material. Such methods are known as STI process (STI=shallow trench isolation). As an alternative, it is also possible to employ field oxide isolation processes in order to provide the trenches filled with an insulating material. Following the formation of the gate structures, the substrate portions left free due to the grid structure of insulating trenches and gate structures may then be doped in self-aligning manner in order to generate the source/drain regions.

In the following, it will be illustrated with reference to FIGS. 3a, 3b, 4a, 4b and 5 how erasure, programming and reading can be effected in bitwise manner with the memory cell array according to the invention.

Figure 3A:
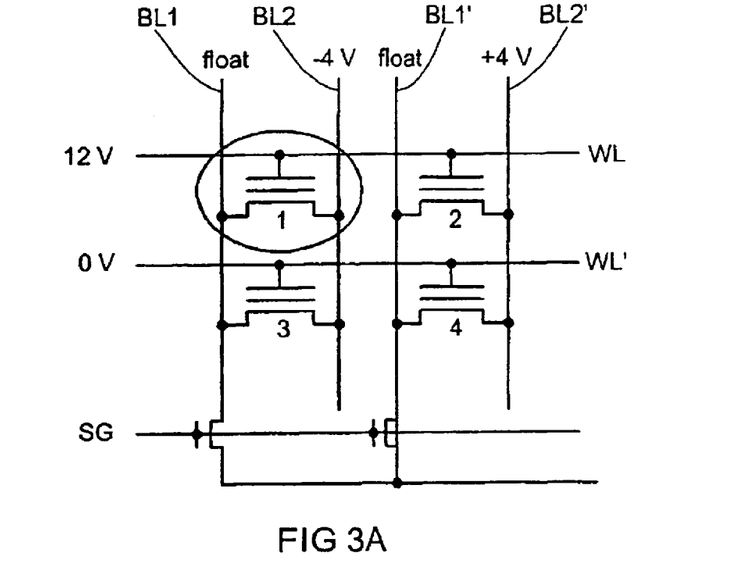
FIGS. 3a and 3b show schematic views to illustrate the voltages to be applied for an erase operation.
Figure 3B:
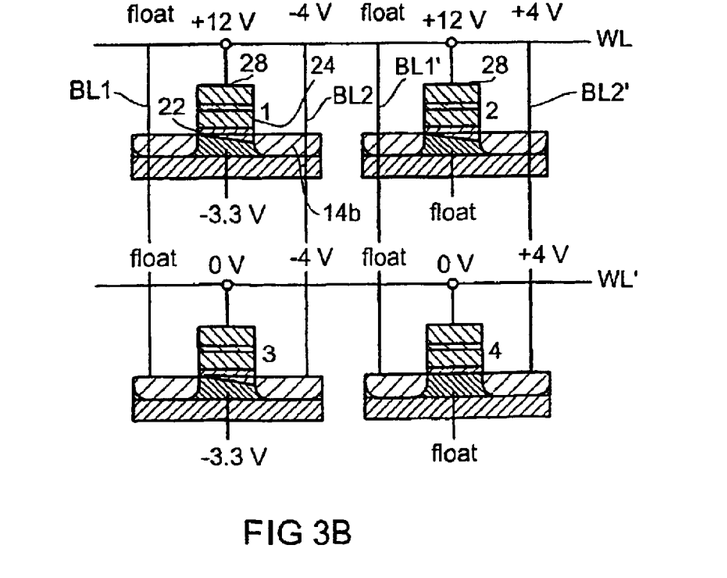

FIG. 3a illustrates the equivalent circuit diagram with the potentials applied for erasure of the encircled memory cell 1. FIG. 3b illustrates substantially the same circuit diagram, however with the transistors of the memory cells 1 to 4 being shown in cross-section to render the physical processes clearer. In FIG. 3a, the first and second bit lines associated with the selected memory cell to be erased are designated BL1 and BL2, while the bit lines of the memory cells adjacent thereto in y-direction are designated BL1' and BL2'.

Bit line BL1 is connected to the source regions of the memory cells 1 to 3, while bit line BL2 is connected to the drain regions of these memory cells. Bit line BL1' is connected to the source regions of memory cells 2 and 4, while bit line BL2' is connected to the drain regions of these memory cells.

Furthermore, the word line associated with the selected memory cell and connected to the control gates of memory cells 1 and 2 is designated WL, while the adjacent word line connected to the control gates of memory cells 3 and 4 is designated WL'. This terminology is used in FIGS. 3b, 4a and 4b as well. Finally, the equivalent circuit diagram of FIG. 3a schematically shows exemplary select gates (SG; SG=select gate) which serve to bring the respective bit lines to the floating state. The manner in which such select gates as well as the further periphery of the memory cell array are to be designed, e.g. for applying suitable voltages, is evident among experts and need not be elucidated in more detail here.

Before discussing in detail the voltages used for erasing, programming and reading of a selected memory cell, it is to be pointed out that these voltages relate to n-channel memory transistors as they are usually employed. However, it is obvious that the polarities of the voltages may be reversed to effect erasure, programming and reading of p-channel memory cells in analogous manner.

For erasing a selected memory cell, in FIG. 3 the memory cell 1 surrounded by the circle, a voltage of +12V is applied to the word line WL by a suitable driving means. Furthermore, a voltage of opposite polarity of −4V is applied to the bit line BL2. The bit line BL1 connected to the source region of this memory cell 1 is floating. Due to the fact that the p-n junction from the drain region to the substrate, i.e. to the channel substrate region, of this memory cell is polarized in forward direction in case of these voltages or potentials applied, the substrate of the memory cell 1 is charged to approx. −3.3V, as shown in FIG. 3b. Due to the reverse substrate driving effect, i.e. the decrease of the initial voltage when the substrate has a positive bias with respect to the drain region, a channel 40 is formed under the gate oxide 22 of the memory transistor 1. Channel 40 thus is at the same potential as the drain region 14b connected to bit line BL2. The total potential difference between control gate 28, which is at +12V by way of the word line WL, and channel 40 thus is 12 V−(−4V)=16V. Thus, there are electrodes tunneling through the gate oxide 22 to the floating gate 24 of memory cell 1.

In case of the non-addressed memory cell 2, the control gate of which is connected to word line WL as well and thus is at a potential of +12V, the positive potential of +4V applied to the drain region of the memory cell 2 via the bit line BL2', reduces the voltage difference to such an extent that tunneling no longer occurs. The positive voltage of +4V applied to the second bit line BL2' constitutes a so-called inhibit voltage in order to prevent interfering, undesired tunneling effects in non-addressed memory cells, whose control gates are connected to the same word line as the memory cell addressed, due to the potential applied to this word line. The first bit line BL1', of the memory cell 2 not addressed is floating.

For the memory cells 3 and 4 not addressed, the voltages, i.e. the potential differences between control gate as well as substrate and channel, respectively, are even lower so that tunneling, and thus erasure, does not take place here either. Thus, only the selected memory cell 1 is erased by the applied voltages described.

Figure 4A:
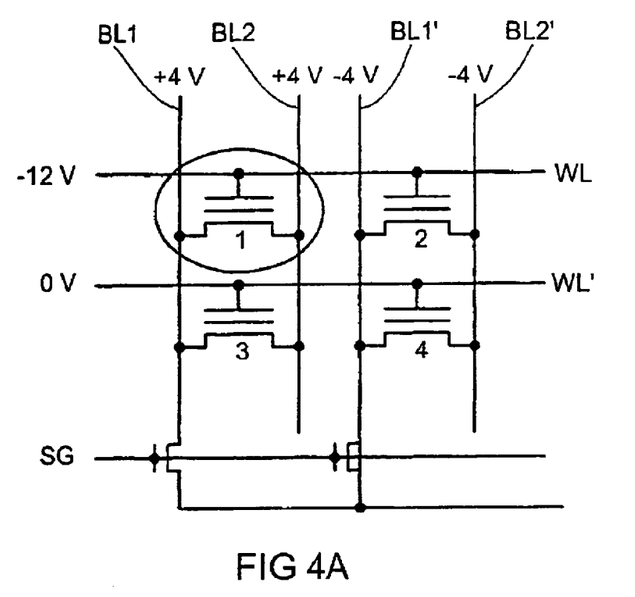
FIGS. 4a and 4b show schematic views to illustrate the voltages to be applied for a programming operation of a selected memory cell.
Figure 4B:
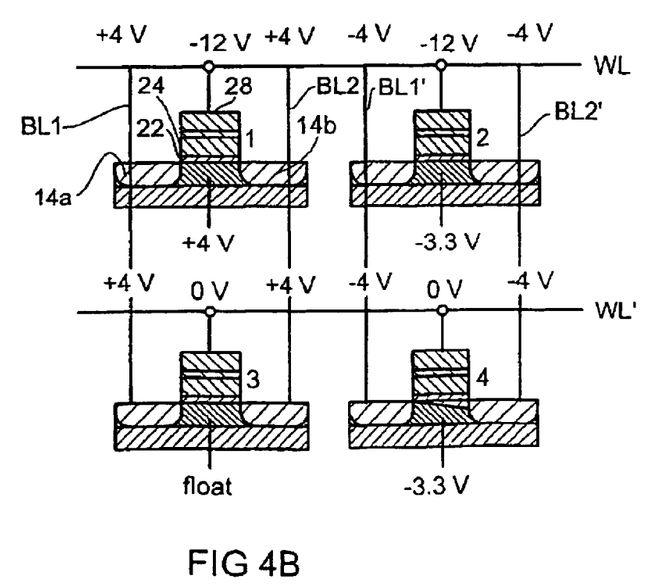

With reference to FIGS. 4a and 4b, the voltages will be described now that are applied by a suitable driving means for programming a selected memory cell, i.e. for extracting charges from the floating gate thereof.

For programming the selected memory cell 1, the word line WL connected to the control gate 28 thereof is at a potential of −12V, while the bit line B1 connected to the source region of memory cell 1 and the bit line BL2 connected to the drain region of memory cell 1 are at a potential of +4V. The p-n junction from the drain region 14b to the substrate 18 now is polarized in reverse or blocking direction. The substrate is nevertheless charged to the drain potential of +4V, as band-to-band tunneling occurs at the drain edge, which in general is referred to as GIDL (GIDL= gate induced drain leakage). This means that holes are generated at the drain region edge, which flow off from the positive drain region towards the substrate until the latter has charged to the drain potential of +4V. The total potential difference between control gate 28 and the substrate or substrate channel region 18 thus is −12V−(+4V)=−16V. Consequently, there are electrodes tunneling from the floating gate 24 via the gate oxide 22 into the substrate. It is essential in this regard that a defined substrate potential can be adjusted without substrate contact, solely by means of the GIDL effect, so that programming of a selected memory cell can be effected without substrate contact.

The first bit line BL1' connected to the source region of the memory cell 2 not addressed, and the second bit line BL2' connected to the drain region of the memory cell 2 not addressed are at a potential of −4V each. The substrate drain diode thus is polarized in forward direction, whereby the substrate is charged negatively and prevents the onset of tunneling from the floating gate. As regards non-addressed memory cells 3 and 4, which are not to be subjected to programming, the voltages are still lower than in case of cell 2, so that programming is not effected here, either. It is thus possible according to the invention to program memory cells in bitwise, i.e. individual, manner without substrate contacts being provided.

Figure 5:
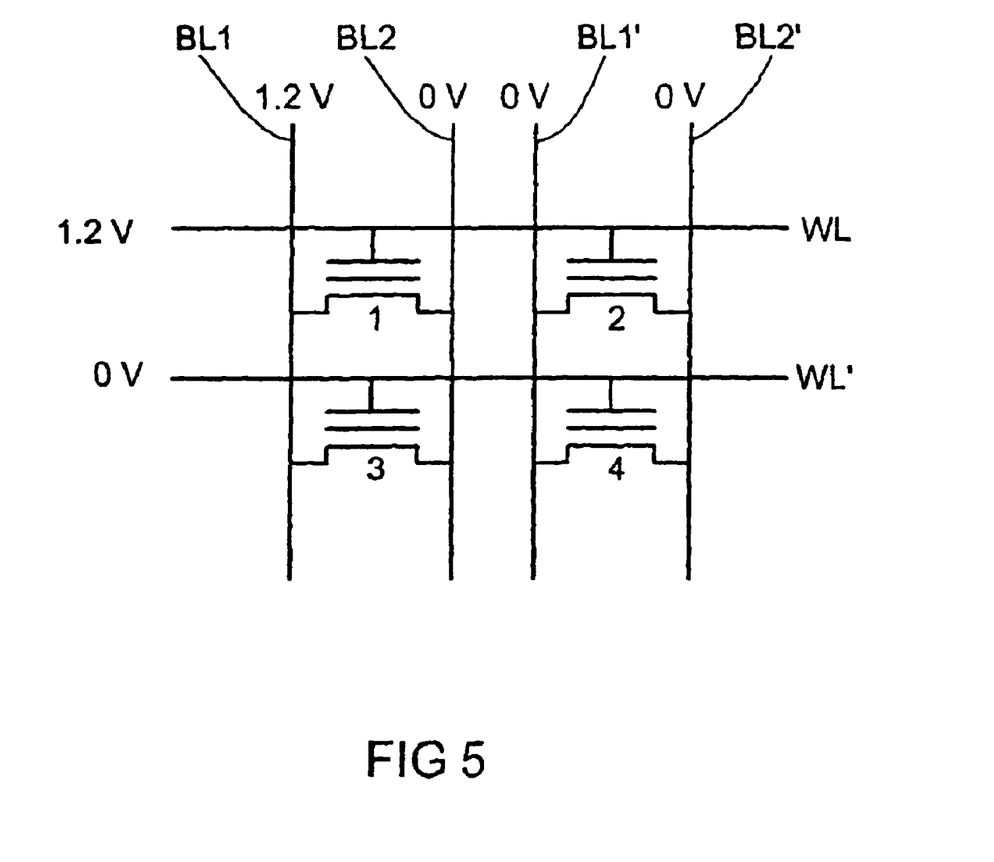
FIG. 5 shows a schematic view for illustrating the voltages to be applied for reading a memory cell.

For bitwise reading of a selected memory cell, in the instant case the memory cell 1, a suitable voltage is applied to the control gate of the memory cell to be read in the usual manner, while a suitable source/drain potential difference is applied at the same time. This is illustrated in FIG. 5 showing a potential of 1.2V at the word line WL and a potential of 1.2V at the first bit line BL1. The potentials for reading must be selected such that tunneling to or from the floating gate does not occur with the voltages chosen. As with conventional memory cells, the channel current at a predetermined gate potential, during reading, is the criterion of decision as to whether a cell is erased or programmed.

The memory cell array described hereinbefore thus renders possible freely selective accessing of individual memory cells of the array, and by way of the inhibit voltages described it is possible to minimize or eliminate disturbances, which are referred to as so-called disturbs in expert circles, of the cells not addressed. However, if specific cells are to be accessed in particularly frequent manner so that frequent erase and programming operations of these cells take place without non-addressed cells being erased or programmed, respectively, it is possible to counteract the thus increasing disturbs with respect to the non-addressed cells by the additional provision of select gates or by software solutions, for example emulations.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A memory cell array, comprising:
   a plurality of memory transistors arranged in a two-dimensional array wherein the two-dimensional array is defined by a first direction and a second direction, each memory transistor having two source/drain regions arranged in a first direction of the memory cell array with a channel substrate region therebetween, and a gate structure arranged above the channel substrate region, said source/drain regions and channel substrate regions being formed in a substrate arranged on an insulating layer, and the channel substrate regions of memory transistors adjacent each other in the first direction being separated from each other by respective source/drain regions extending down to the insulating layer, wherein said source/drain regions and channel substrate regions of memory transistors adjacent each other in a second direction of the memory cell array are isolated from each other by trenches filled with insulating material and formed in the substrate so as to extend down to the insulating layer.

2. A memory cell array according to claim 1, wherein the source/drain regions and the channel substrate regions are formed in the silicon layer of an SOI wafer.

3. A memory cell array according to claim 1, wherein the gate structure of the memory transistors consists of a layer sequence comprising an insulating gate layer, a floating gate on the insulating gate layer, an intermediate dielectric on the floating gate and a control gate on the intermediate dielectric.

4. A memory cell array according to claim 3, further comprising word lines connected in electrically conductive manner to control gates of a row of memory transistors arranged in said second direction.

5. A memory cell array according to claim 4, further comprising bit lines, with a respective row of memory transistors arranged in the first direction having first and second bit lines associated therewith and the source/drain regions of the memory transistors of the row being connected in electrically conducting manner to the first bit line and the second bit line in alternating fashion.

6. A memory cell according to claim 5, further comprising a means for introducing charges to the floating gate of a selected memory transistor of the memory cell array, which applies a potential of a first polarity, at which a channel is formed in the channel substrate region, to the word line connected to the control gate of the selected memory transistor, and applies a potential of a second polarity opposite to said first polarity to one of the source/drain regions of the selected memory transistor in order to bring charges to the floating gate of the selected memory transistor.

7. A memory cell array according to claim 6, wherein said means for introducing charges furthermore applies a potential of said first polarity to one of the source/drain regions of the memory transistors—excluding the selected memory transistor—having their control gates connected to the word line that is connected to the control gate of the selected memory transistor.

8. A memory cell array according to claim 7, further comprising a means for removing charges from the floating gate of a selected memory transistor, which applies a potential of said second polarity to the word line connected to the control gate of the selected memory transistor and applies a potential of said first polarity to both source/drain regions of the selected memory transistor in order to remove charges from the floating gate of the selected memory transistor.

9. A memory cell array according to claim 8, wherein said means for removing charges furthermore applies a potential of said second polarity to the source/drain regions of the memory transistors—excluding the selected memory transistor—having their control gates connected to the word line that is connected to the control gate of the selected transistor.

10. A method of making a memory cell array, comprising the steps of:

forming strip-shaped trenches, filled with insulating material, in a semiconductor substrate arranged on an insulating layer, said insulating trenches extending down to the insulating layer;

forming strip-shaped gate structures which extend substantially perpendicularly to the trenches filled with insulating material and, together with said trenches, constitute a grid-like structure; and doping the substrate regions left free between the grid-like structure so as to form source/drain regions extending down to the insulating layer.

11. A method according to claim 10, further comprising the steps of:

forming word lines on the gate structures; and forming bit liens, with a first and a second bit line each being associated with a row of source/drain regions arranged in the direction of the trenches filled with insulating material, and the source/drain regions being connected in alternating fashion to said first and second bit lines.

* * * * *